United States Patent [19]

Lewis

[11] Patent Number: 4,642,506

[45] Date of Patent: Feb. 10, 1987

[54] SURFACE ACOUSTIC WAVE DEVICE WITH REFLECTORS IN INTER-ELECTRODE LOCATION

[75] Inventor: Meirion F. Lewis, Malvern, England

[73] Assignee: The Secretary of State for Defence in Her Britannic Majesty's Government of the United Kingdom of Great Britain and Northern Ireland, London, England

[21] Appl. No.: 660,234

[22] Filed: Oct. 12, 1984

[30] Foreign Application Priority Data

Oct. 14, 1983 [GB] United Kingdom ................. 8327551

[51] Int. Cl.$^4$ ............................................. H01L 41/08
[52] U.S. Cl. ............................ 310/313 D; 310/313 R; 310/313 C; 333/193
[58] Field of Search ........... 310/313 R, 313 B, 313 D, 310/313 C; 333/193-196, 150-155

[56] References Cited

U.S. PATENT DOCUMENTS

| | | | |
|---|---|---|---|
| 3,866,154 | 2/1975 | Moore | 310/313 D X |
| 4,353,046 | 10/1982 | Hartmann | 310/313 D X |
| 4,384,228 | 5/1983 | Dias | 310/313 D |
| 4,422,000 | 12/1983 | Yamada et al. | 310/313 D |
| 4,429,246 | 1/1984 | Miyajima | 333/195 X |

FOREIGN PATENT DOCUMENTS 0015519 1/1982 Japan ........................................ 195/

Primary Examiner—Mark O. Budd
Attorney, Agent, or Firm—William R. Hinds

[57] ABSTRACT

An acoustic transducer is arranged as a ladder having uprights and rungs consisting of contact pads and interdigital fingers respectively. The transducer has interrung spaces 17 occupied by arrays of reflector strips. Each reflector strip is offset by $\lambda/8$ from a respective position distant $\tfrac{1}{2}n\lambda$ from a transducer finger center, $\lambda$ being the transducer finger center and n as integer. The $\lambda/8$ offset reflector strips provide constructive interference between transducer output waves travelling in one direction and destructive interference in the opposite direction. This provides a transducer with undirectional properties which can be manufactured in one metal deposition process. Unwanted reflections at fingers may be reduced by additional blooming reflector banks or by repositioning reflector strips to provide both unidirectional and blooming properties. Other options include variation in spatial periodicity, overlap, length, width and/or number of reflector strips and/or transducer fingers.

23 Claims, 11 Drawing Figures

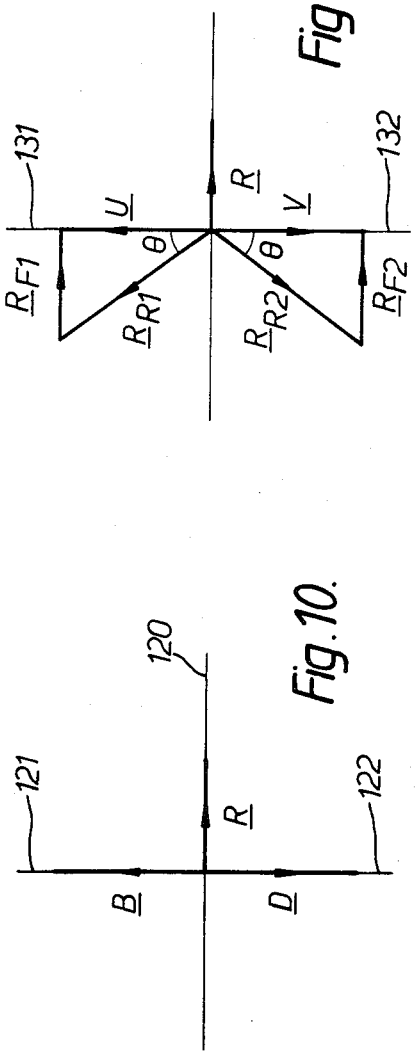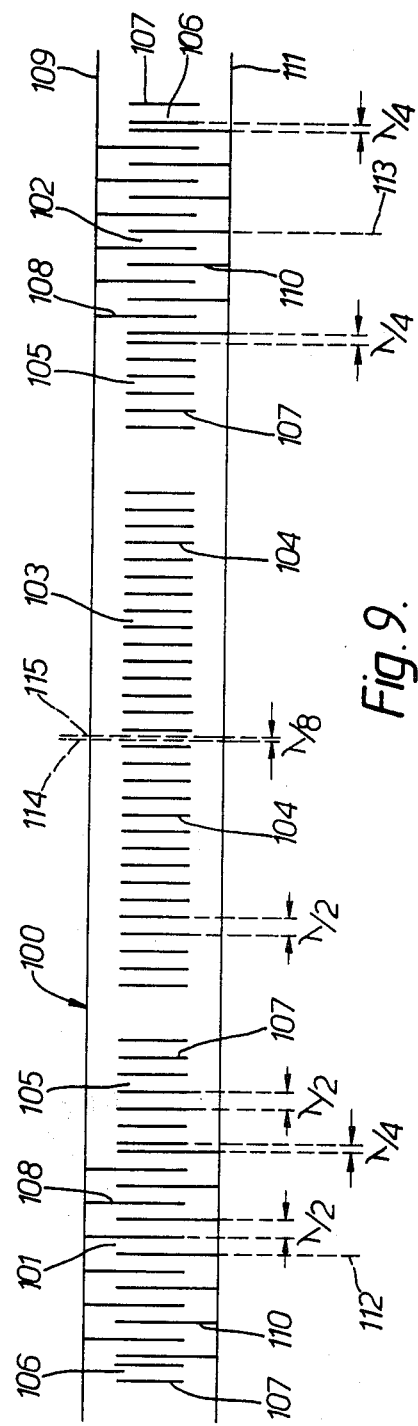

SURFACE ACOUSTIC WAVE DEVICE WITH REFLECTORS IN INTER-ELECTRODE LOCATION

This invention relates to an acoustic transducer.

Acoustic transducers are well known in the prior art. They are employed for example in surface acoustic wave (SAW) devices such as electronic filters, as set out in "Surface Wave Filters", Matthews, H. (Ed), Wiley 1977. A typical transducer comprises a pattern of conductors laid upon a piezoelectric substrate. The conductors may take the form of two comparatively broad parallel metal contact pads arranged longitudinally with narrow lateral "fingers" extending inwardly therebetween. The fingers are interdigitated, and ac signals applied between the contact pads appear longitudinally between adjacent finger pairs to induce acoustic waves in the piezoelectric substrate. The waves may be SAW, SSBW (surface skimming bulk wave) or other similar waves. Such transducers are referred to as interdigital transducers or IDTs.

Conventional SAW or SSBW filters incorporating IDTs are small, cheap, reproducible, passive and planar, and cover the frequency range 10 MHz to 1 GHz or more with excellent group delay and stop band rejection characteristics. However, it is well known that conventional SAW or SSBW IDTs are bi-directional, i.e. the transducers generate acoustic waves in two mutually opposite directions. Accordingly, a conventional SAW filter incorporating two IDTs has an inherent insertion loss of 6 dB, since part of the signal generated by the emitting transducer is directed away from the receiving transducer. Furthermore, a spurious signal is generated known as the triple transit signal arising from multiple passage of acoustic waves through the device. Normal design arrangements to suppress the unwanted triple transit signal commonly increase the insertion loss to 20 dB.

A number of techniques have been proposed to reduce the insertion loss of SAW filters. These include multistrip coupler-based unidirectional IDTs (Marshall et al, Electronics Letters 1971, 7, pp 312-314), twoport resonators (Marshall, F. G., Proc. 1975 IEEE Ultrasonics Symposium pp 290-292), multiphase IDTs (Rosenfeld et al., Proc. 28th Annual Frequency Control Symposium pp 299-303), interdigitated IDTs (Lewis, M. F., Proc. 1982 IEEE Ultrasonics Symposium pp 12-17), and so on. These prior art devices have one or more of a number of disadvantages, such as increased substrate area, complex fabrication and matching circuitry, and a restricted range of realisable filter characteristics.

It has also been proposed (Hartman et al., Proc. 1982 IEEE Ultrasonics Symposium pp 40-45) to construct an IDT incorporating a superimposed reflector array having elements offset by $\lambda/8$ ($\lambda$=fundamental wavelength) from spatial periodicity with the transducer finger centres. This device comprises a known interdigital finger arrangement produced by evaporating firstly aluminium on to a piezoelectric substrate, and secondly a gold reflector array produced by a second metal evaporation procedure. The reflector array reduces the 3 dB bidirectionality loss of the IDT arising from SAW generation in two opposite directions. It produces interference which enhances the required forward wave at the expense of the unwanted backward wave. However, this IDT has the disadvantage of requiring two evaporative processes for laying down the transducer fingers and reflector array, which must be carefully aligned with respect to one another to produce the necessary wave interference.

It is an object of the invention to provide an alternative form of unidirectional interdigital transducer.

The present invention provides an acoustic transducer arranged on a piezoelectric substrate as a ladder having rungs comprising interdigital fingers and having one or more reflector strips arranged in inter-rung positions appropriate to enhance acoustic wave generation in one direction and to reduce acoustic wave generation in the opposite direction in a given frequency band. The invention provides the advantage that the transducer fingers and the reflector array may be laid down on a substrate in one metal evaporation process, instead of two such processes requiring mutual alignment as in the prior art.

The transducer may have more than two rungs with each inter-rung space occupied by a respective reflector array of parallel strips. Each strip may be offset by substantially $\lambda/8$ from a respective location distant a discrete number of half-wavelengths from a transducer finger centre, $\lambda$ being the wavelength corresponding to the transducer fundamental frequency. The transducer may incorporate additional parallel reflector strips arranged externally of the rungs. The transducer finger length and/or the reflector strip length may be weighted to obtain any desired transducer characteristics.

Two transducers of the invention may be arranged on the same substrate to emit and receive acoustic waves either towards or away from one another, the former arrangement provided a bandpass filter and the latter a bandstop filter.

The transducer may be associated with acoustic absorbers arranged on the substrate to absorb unwanted acoustic waves.

The transducer may either be spatially periodic, i.e. have rungs separated by constant distances, or alternatively be aperiodic or have varying periodicity.

The transducer may have weighted finger overlap varying in accordance with a sampled Fourier transform of a rectangular function with reflectors located in regions corresponding to zero overlap. Two such transducers may be formed on a substrate to provide a bandpass or bandstop filter.

The transducer may have arrays of reflector strips positioned both for unidirectional properties and for reduction of transducer reflections. In this arrangement the transducer strips are offset by $(\lambda/8)+(\lambda/4\pi)$ arcsin (M/N) from spatial periodicity with transducer fingers, where M is the number of fingers per transducer rung, N is the number of reflector strips per array and N is greater than M.

In order that the invention might be more fully understood, embodiments thereof will now be described, by way of example only, with reference to the accompanying drawings, in which:

FIG. 1 schematically shows two ladder transducers of the invention arranged as a SAW filter;

FIG. 2 schematically shows a section of a transducer of the invention;

FIGS. 3 to 6 schematically illustrate forms of interdigital transducer which may be incorporated in a transducer of the invention;

Figure 2:
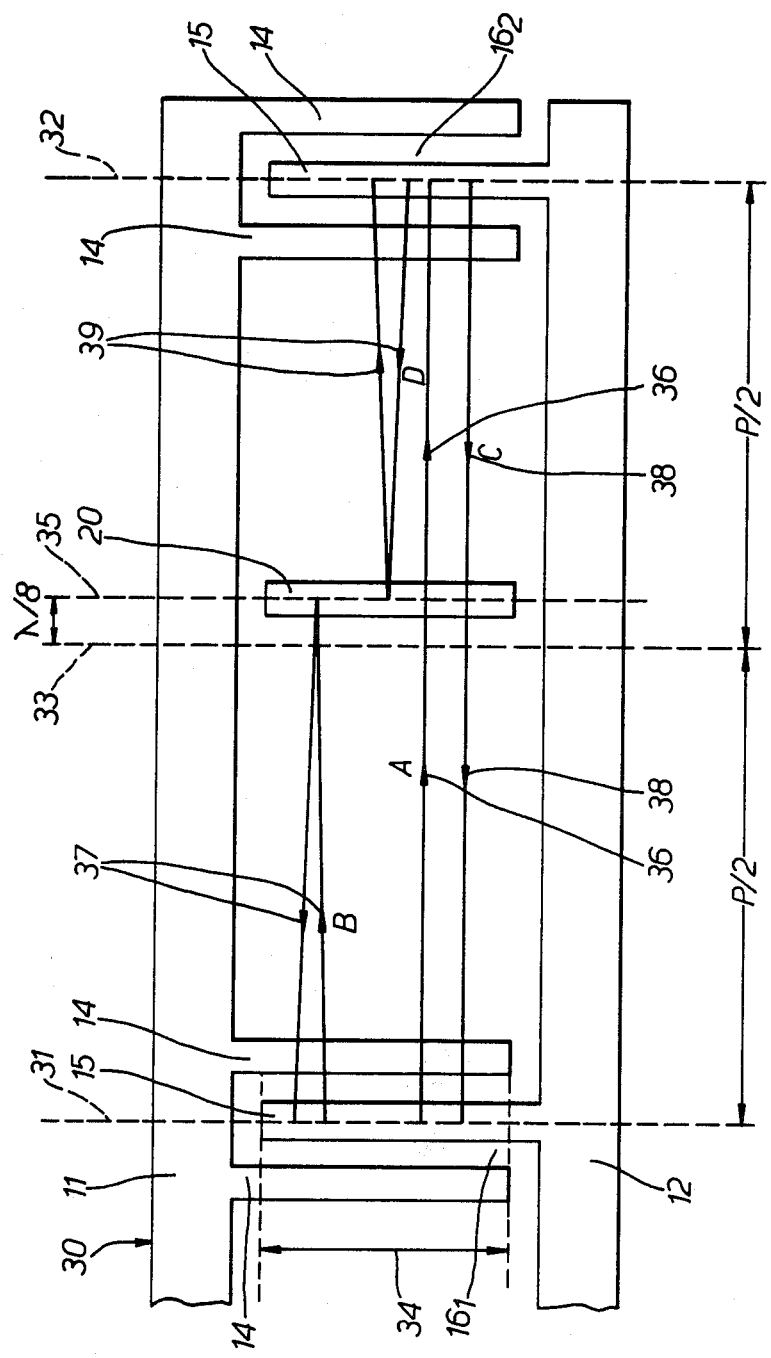

FIG. 9 schematically shows a section of a transducer of the invention incorporating blooming reflector strips;

FIG. 10 is a vector diagram of acoustic wave propagation in FIG. 2;

FIG. 11 is a vector diagram of acoustic wave propagation in a transducer of the invention having a reflector array arranged for both antireflection and unidirectional properties.

Figure 1:
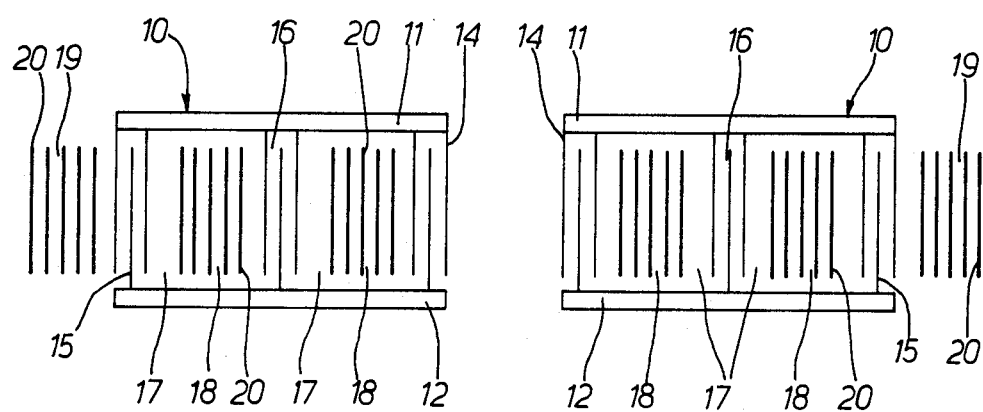

Referring to FIG. 1, which is not to scale, there are schematically shown two acoustic transducers 10 of the invention arranged to form a SAW filter. Each transducer 10 comprises two broad longitudinal upper and lower contact pads 11 and 12. The upper pads 11 have pairs of inwardly extending narrow fingers such as 14, and the lower pads 12 have individual fingers 15. The pads 11 and 12 and fingers 14 and 15 are formed by evaporating aluminium on to a piezoelectric substrate (not shown) and subsequent photolithography. The fingers 14 and 15 are interdigitated, and form regularly spaced finger groups such as 16 resembling the rungs of a ladder for which the contact pads 11 and 12 would be uprights. Because of this resemblance, transducers generally of the form 10 are referred to in the art as ladder transducers. AC signals applied across the contact pads 11 and 12 appear longitudinally between any two adjacent fingers 14 and 15, or finger pair, and produce acoustic waves in the piezoelectric substrate. In the art, the term finger pair accordingly refers to two adjacent fingers, one from each contact pad (but not a "split finger" from one pad).

The transducers 10 have inter-rung spaces 17 occupied by reflector arrays 18. A further reflector array 19 is located adjacent to each transducer 10 remote from the other. Each reflector array 18 or 19 incorporates five narrow reflector strips such as 20. Each strip 20 is $\frac{1}{4}\lambda$ wide, and the gap between adjacent strips is also $\frac{1}{4}\lambda$, $\lambda$ being the acoustic wavelength corresponding to the filter centre frequency. The spacing between centres of adjacent strips 20 is accordingly $\lambda/2$. It should be noted that $\lambda$ varies along a transducer, having differing values in metal-coated and uncoated substrate regions. This is well known in the art, and in practice $\lambda$ is an average value. The reflector arrays 18 and 19 of each transducer 10 are arranged to enhance SAW propagation towards the other transducer and to reduce SAW propagation away from it. This is achieved by positioning the reflector arrays 18 and 19 to provide constructive interference in one direction and destructive interference in the other, as will be described.

Referring now to FIG. 2, there is shown a section 30 of a ladder transducer 10 in more detail, although not to scale, parts equivalent to those described in FIG. 1 being like-referenced. For clarity, only one reflector strip 20 is shown. The section 30 corresponds to the left hand transducer 10 in FIG. 1. It has two finger groups $16_1$ and $16_2$ with centres indicated by chain lines 31 and 32 respectively. A chain line 33 indicates points midway between centres 31 and 32. The distance between centres 31 and 32 or rung-to-rung period is P, where $P = 2n\lambda$, n being an integer and $\lambda$ the wavelength previously defined. The transducer section 30 has an aperture Q indicated by arrow 34 and given by the overlap of adjacent fingers 14 and 15. Q may be in the order $50\lambda$ to $100\lambda$. The reflector strip 20 is positioned as indicated by chain line 35 offset by $\lambda/8$ from the mid-point 33 of finger-group or rung centres 31 and 32. Other reflecting strips (see FIG. 1) are arranged with centres spaced at $\frac{1}{2}\lambda$ intervals from that of strip 20.

Acoustic waves produced by finger group $16_1$ and propagating to the right comprise portions A and B indicated by arrows 36 and 37 transmitted and reflected by the reflector strip 20 respectively. Acoustic waves produced by finger group $16_2$ and propagating to the left comprise portions C and D transmitted and reflected by the strip 20 and indicated by arrows 38 and 39 respectively.

The filter illustrated in FIGS. 1 and 2 operates as follows. An acoustic reflector array such as 18 comprising periodic reflectors constitutes a reciprocal symmetrical two-port junction. If the junction is lossless, a wave of unit amplitude incident at one side or port of the array produces transmitted and reflected amplitudes $s_{12}$ and $s_{11}$ which are in phase quadrature when referred to the reflector array centre. This result may be derived from a similar analysis to that for the three-port case given by Lewis, M. F. in IEEE 1983 SU-30 pp 55-57. The unit amplitude wave incident on one side of the reflector array is transformed into symmetric and antisymmetric combinations of waves incident from both sides, viz $$\begin{pmatrix} 1 \\ 0 \end{pmatrix} = \begin{pmatrix} +\frac{1}{2} \\ +\frac{1}{2} \end{pmatrix} + \begin{pmatrix} +\frac{1}{2} \\ -\frac{1}{2} \end{pmatrix}.$$

These particular orthogonal combinations are chosen because they are not mutually coupled by a symmetric or antisymmetric junction. Each accordingly emerges at full intensity but with a phase shift, i.e. they emerge as $$\begin{pmatrix} +a \\ +a \end{pmatrix} \text{ and } \begin{pmatrix} +b \\ +b \end{pmatrix} \text{ with } |a| = |b| = \frac{1}{2}.$$

Thus $s_{11} = (a+b)$ and $s_{12} = (a-b)$ are orthogonal, or in phase quadrature, since the scalar produce of $(a+b)$ and $(a-b)$ vanishes if $|a| = |b|$.

In addition to the phase shift of $\frac{1}{2}\pi$ between transmitted and reflected waves A and B or C and D, the offset of each reflector strip 20 by $\lambda/8$ from positions separated by integral multiples of $\frac{1}{2}\lambda$ from finger group centre 31 or 32 produces a further phase shift of $2 \times \lambda/8$, i.e. $\lambda/4$ or $\frac{1}{2}\pi$ between transmitted and reflected wave combinations A and D or B and C travelling in the same direction. This further phase shift will be added to that between waves travelling in one direction, and be subtracted from that between waves travelling in the other direction. This argument does not however determine in which direction addition or cancellation takes place. However, there is constructive interference in one direction and destructive interference in the other, and each transducer 10 accordingly has unidirectional properties. This analysis ignores reflections at transducer rungs $16_1$ and $16_2$, which will be considered later.

The transducers 10 are arranged to emit or receive acoustic waves to or from one another. In view of their unidirectional properties, generation of unwanted acoustic waves travelling away from the receiving transducer is greatly reduced. This greatly reduces the insertion loss generated by the filter arrangement of FIG. 1.

The unidirectional properties of the transducers 10 are independent of the reflection mechanism of the strips 20. These properties obtain for reflection in SAW devices by mass-loading, topographical effects, piezoelectric shorting or combinations thereof.

Any significant loss in the reflector strips 20 would modify the $\lambda/8$ offset condition, but then the transducer or device incorporating it would not exhibit low loss. Accordingly the offset in any practical device would be substantially, that is very close to $\lambda/8$, or the equivalent for reflector arrangements which provide both for unidirectionality and blooming, as will be described later.

Since the reflector strips 20 are located in inter-rung spaces 17 or adjacent each transducer 10, there is no requirement to overlay transducer fingers with reflectors as in the prior art. Accordingly, the fingers and reflectors may be laid down in one metal evaporation process without the need to align a finger pattern with a subsequent reflector pattern—a difficult task which increases costs. Furthermore, the reflector strips may be electrically isolated from one another and from the transducer, or may be shorted together, and earthed if necessary as appropriate in individual arrangements to optimise performance. This is not possible in the prior art, in which gold reflectors are shorted electrically to transducer fingers.

Figure 3:
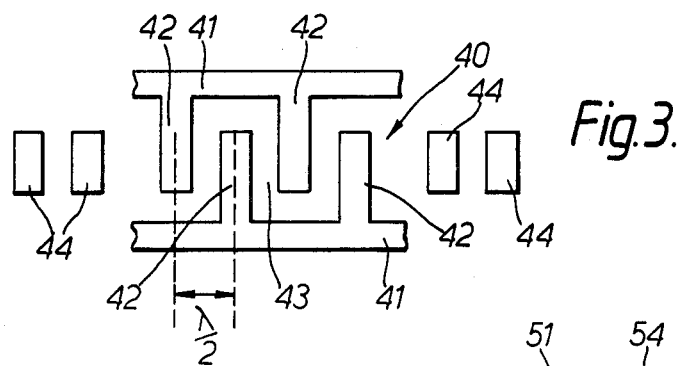
Figure 4:
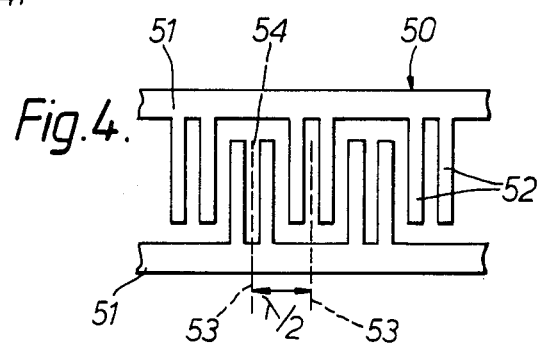
Figure 5:
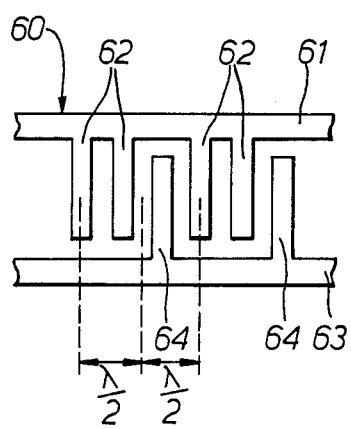

Inter-rung reflectors may be employed in accordance with the invention with a ladder transducer having any conventional finger groups or rungs. Referring now to FIGS. 3, 4 and 5, which are not to scale, there are shown three different forms of finger group indicated generally by 40, 50 and 60 respectively. Finger group 40 is of the "one into one" variety. Each contact pad 41 has two inwardly extending fingers 42 which are $\lambda/4$ in width. Each gap such as 43 between a finger of one pad and an adjacent finger of the other is also $\lambda/4$, finger centres being spaced $\lambda/2$ apart. Conventional anti-reflection or blooming strips 44 are located adjacent to the finger group 40. The strips 44 have $\lambda/4$ widths and gaps therebetween, and are offset by $\pm\lambda/4$ from a spatially periodic continuation of the transducer finger pattern of $\lambda/2$ between finger centres. (Depending on the number of fingers 42, i.e. on the strength of reflections from the finger group, the reflectors 44 may sometimes be omitted.)

Finger group 50 comprises contact pads 51 with inwardly extending split fingers such as 52. Reflector arrays (not shown) in accordance with the invention would be located relative to the centre 53 of the respective internal gap 54 of a split finger. Adjacent centres 53 are $\lambda/2$ apart, and individual fingers 52 and internal gaps 54 are $\lambda/8$ wide. Split fingers have properties which avoid reflections occurring at transducer working frequencies.

Finger group 60 is of the "two into one" variety, a first contact pad 61 having four inwardly extending fingers 62 per rung and the other pad 63 having two fingers 64. Finger widths and gaps are $\lambda/6$.

The patterns of fingers shown in FIGS. 3, 4 and 5 may be extended laterally to provide larger finger groups if required to produce transducers with particular properties.

Figure 6:
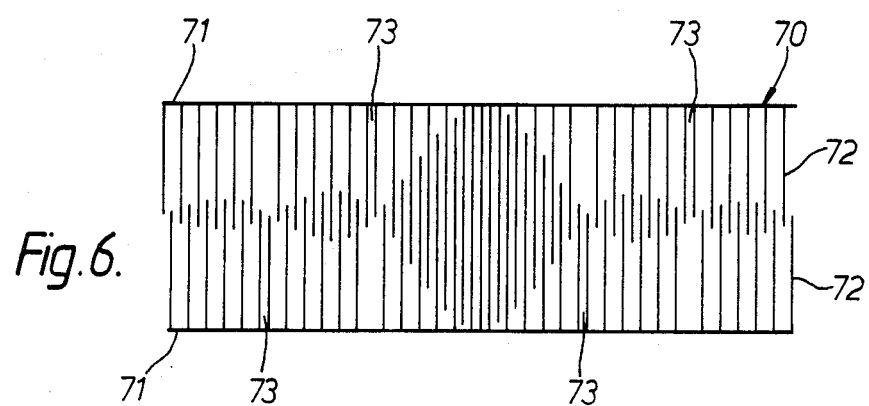

In addition to transducers such as 40, 50 or 60 having constant finger overlap, finger length weighting may be employed as in the prior art to obtain specific transducer characteristics. In particular, finger overlap and phasing may be varied in accordance with a Fourier transform along filter transducers in order to improve filter passband characteristics and reduce sidebands. Such a transducer is shown in FIG. 6. The transducer 70 has contact pads 71 and interdigital fingers such as 72. Finger overlap (weighting) and phasing is arranged as nearly as possible in accordance with a Fourier transform of a rectangular or square function, $f(x)$, eg $f(x)=a$ constant for $x_1 \leq x \leq x_2$, and $f(x)=0$ elsewhere. Although adjacent fingers extend largely from alternate contact pads 71, as indicated at four regions 73 two fingers extend from the same respective contact pad 71. This corresponds to phase reversal between adjacent lobes of the $\sin x/x$ Fourier transform function for a square filter passband. In accordance with the invention, the transducer 70 would have associated reflector strips (not shown) to provide unidirectional properties, and a filter having two such transducers would have an approximately square passband. For example, the transducer 70 may be "sampled", i.e. have fingers omitted to provide spaces to accommodate reflector strips. Conveniently, fingers may be omitted at regions 73 of zero finger overlap.

Other options in transducer design include the use of absorbing material on the piezoelectric substrate to attenuate unwanted acoustic waves.

Figure 7:
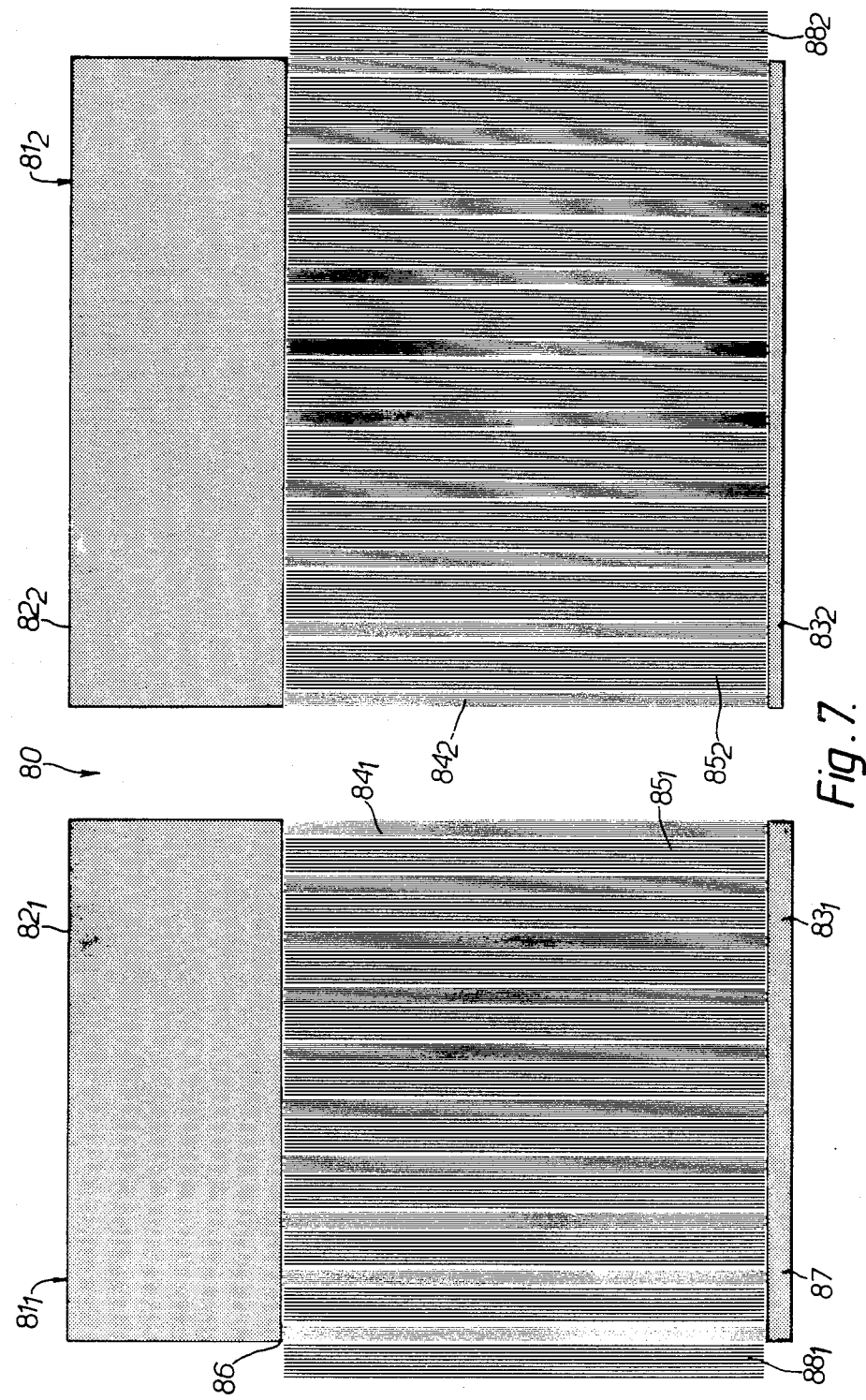
FIG. 7 shows an enlarged view of a practical SAW filter incorporating ladder transducers of the invention.

Referring now to FIG. 7, there is shown a SAW filter 80 incorporating two ladder transducers $81_1$ and $81_2$ of the invention on a lithium niobate piezoelectric substrate. The transducers are shown slightly closer together than in the actual device for presentational purposes. The transducers $81_1$ and $81_2$ have respective upper contact pads $82_1$ and $82_2$, lower contact pads $83_1$ and $83_2$, ten rungs such as $84_1$ and $84_2$ and inter-rung reflector arrays such as $85_1$ and $85_2$. The rungs 84 incorporate five split fingers such as 86 (see FIG. 4), three of which per rung extend from upper contact pads 82 and two from lower contact pads 83. The reflector strips such as 87 in the arrays 85 are $\lambda/4$ wide with $\lambda/4$ gaps, so that the strips are spaced by $\lambda/2$, where $\lambda$ is 34.5 $\mu$m for the filter centre frequency of 100 MHz. The rung to rung period or rung centre spacing is $8\lambda$ in transducer $81_1$ and $10\lambda$ in transducer $81_2$. There are ten and fourteen reflector strips per array 85 in transducers $81_1$ and $81_2$ respectively. The transducers $81_1$ and $81_2$ have additional external reflector arrays $88_1$ and $88_2$ respectively which are periodic extensions of arrays $85_1$ and $85_2$.

The reflector arrays $85_1$ and $85_2$ are offset by $\lambda/8$ to the right and left respectively from symmetrical positioning in inter-rung spaces. This can be seen from the differing finger group/reflector array separations either side of rungs 84 in the transducers 81. This offset towards the other transducer in either case produces unidirectionality of the transducers towards one another in Y-Z lithium niobate; i.e. the transducers 81 emit or receive acoustic waves preferentially towards one another, which is termed a "face to face" configuration. (This would not necessarily be the case for other piezoelectric materials, since it is necessary to test a given transducer and material for output direction. The analysis given earlier did not predict the output direction.) If the offset were to have been away from the other transducer, a back to back configuration would have resulted.

FIG. 7 is an enlarged reproduction of the art work of a practical SAW filter. The filter's actual length was about 7 mm measured between the outermost strips of reflector arrays $88_1$ and $88_2$, but it had a slightly larger gap than the scale of the drawing would imply.

The separation of the transducers 81 (if perfect) is not absolutely critical, but preferably the reflector arrays of one transducer would be located as periodic extensions of those of the other.

The filter of FIG. 7 was tested together with a comparison filter having identical transducers but in a back to back configuration, i.e. reflector arrays offset by $\lambda/8$ away from the other transducer. In both cases the transducers were aluminium evaporated onto a Y-Z lithium niobate substrate. The filters were mounted in a T08 container, and the contact pads were 0.15 $\mu$m thick with gold wire bonds. Each transducer was shunt tuned with a wire-wound inductor of 100 nH to achieve a close match to 50 ohms.

Figure 8:
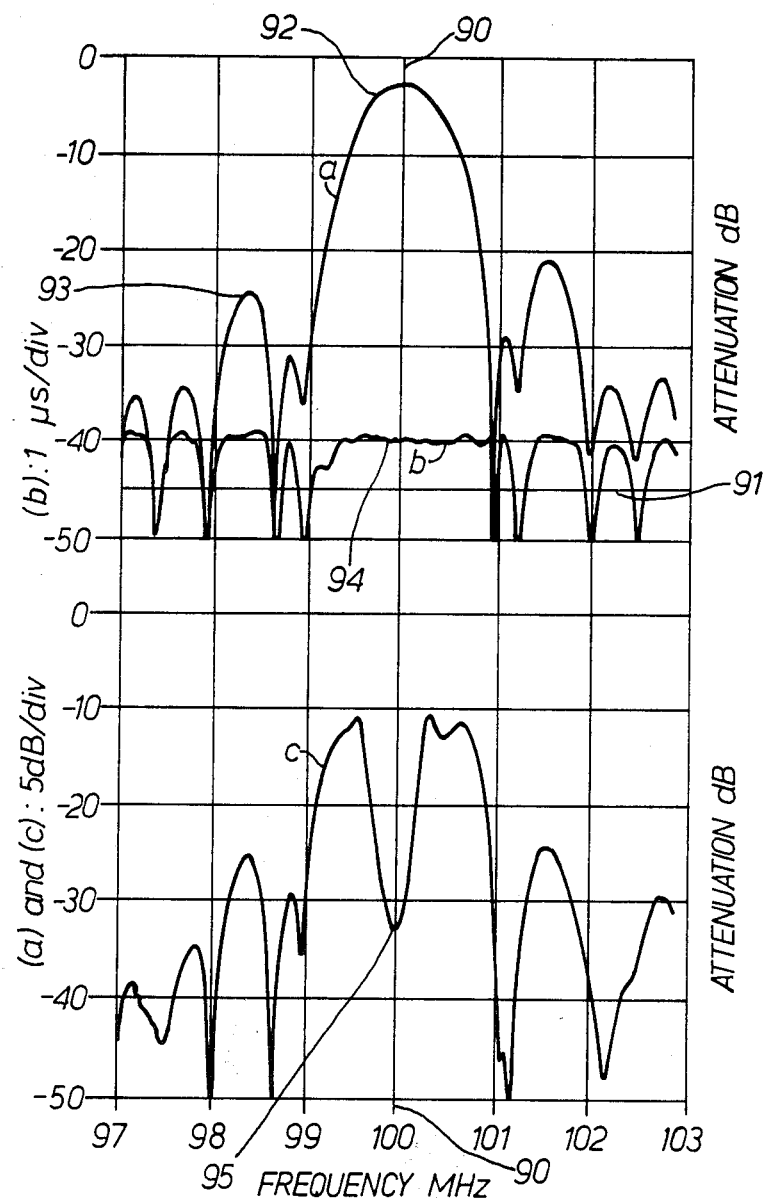
FIG. 8 shows attenuation/frequency and group delay/frequency relationships for SAW filters incorporating transducers shown in FIG. 7.

The performance of the test filters is shown in FIG. 8, which shows three curves (a), (b) and (c). Curves (a) and (c) show filter attenuation as a function of frequency, and corresponds to transducers face-to-face and back-to-back respectively. The fundamental or centre frequency of 100 MHz is indicated at 90, and the frequency scale is 0.5 MHz per division, curves covering the region 97 MHz to 103 MHz. The ordinate scale is 5 dB per division. Curve (b)shows the variation in group delay through the face-to-face filter (curve (a)), the ordinate scale being 1 $\mu$sec per division referred to a baseline 91 with the same frequency scale.

A practical bandpass SAW filter of the invention would exhibit the curve (a) characteristic of a central maximum 92 or passband with associated subsidiary maxima such as 93. The filter had a measured insertion loss at the 100 MHz fundamental frequency of only 2.7 dB. This compares with a minimum *theoretical* loss of $\sim 6$ dB for a prior art SAW filter, and in practice a matched loss of typically 8 to 10 dB. It will also be observed that the passband ripple at 92 is less than 0.5 dB peak-to-peak, and that the group delay at 94 is $\sim 1$ $\mu$sec with a ripple of $\sim 0.2$ $\mu$sec peak-to-peak. Both of these are low values for a SAW filter.

The high degree of unidirectionality of the transducers is indicated by a pronounced central minmum 95 in curve (c) at the 100 MHz fundanental frequency. The minimum 95 corresponds to a loss of 31.9 dB, or about 29 dB below the position of the corresponding maximum 92 in curve (a). The back-to-back transducers employed for the curve (c) filter generate and receive acoustic waves predominantly away from one another at 100 MHz, so that the fundamental frequency is strongly rejected. This property could be used to provide a bandstop filter.

Tests were also performed using the curve (a) or face-to-face filter in a completely untuned configuration. This resulted in an insertion loss of still only 3 dB, although with somewhat greater passband/group delay ripple. This embodiment's comparative insensitivity to lack of tuning is of importance in applications requiring minimisation of size, cost or vibration sensitivity.

Referring now to FIG. 9, there is shown a section 100 of a ladder transducer of the invention which is "bloomed" to reduce unwanted multiple transit signals. The term "bloomed" and similar expressions are employed by analogy with optical blooming of lenses with anti-reflection coatings. The section 100 has two rungs 101 and 102 and a central bank 103 of thirty reflector strips such as 104 with $\lambda/2$ centre spacing. Banks 105 are shown in full and banks 106 in part. Each rung 101/102 has six fingers such as 108 extending from an upper contact pad 109 and seven fingers such as 110 extending from a lower contact pad 111. Adjacent finger pairs 108/110 have $\lambda/2$ spacing between centres. In operation, the upper contact pad 109 carries the rf signal and the lower contact pad is earthed.

The blooming reflector banks 105 and 106 are separated by $\lambda/4$ from a periodic continuation of the respective rungs 101 and 102. The centres 112 and 113 of the rungs 101 and 102 have a mid-point indicated by a chain line 114. A further chain line 115 indicates the centre of the unidirectional reflector bank 103, and is separated or offset from inter-rung mid-point 114 by $\lambda/8$.

The section 100 has both unidirectional and antireflection properties, and may have as many rungs and associated unidirectional and blooming reflectors as may be required for individual applications. The use of blooming reflectors are an alternative to split fingers shown in FIG. 4, which are difficult to produce for operation above 500 MHz where the $\lambda/8$ width is less than 1 $\mu$m. An attraction of the arrangement of FIG. 9 is that all reflectors and transducer fingers have the same width $\lambda/4$, which is beneficial in production.

In the examples hereinbefore described, reflection of acoustic waves at transducer fingers have either been ignored for convenience (FIGS. 1 and 2), or disposed of by split finger transducers (FIGS. 4 and 7) or blooming (FIG. 9). Referring now to FIG. 10 and also to FIG. 2, consider acoustic wave A indicated by arrow 36 propagating from transducer rung of finger group $16_1$ to rung $16_2$. Wave A will be partially reflected to form a wave (not shown in FIG. 2) travelling from rung $16_2$ to rung $16_1$. Similarly, wave C will be partially reflected at rung $16_1$ to form a wave travelling towards rung $16_2$. The rungs $16_1$ and $16_2$ have equal numbers of equally reflecting fingers 14 and 15, and the two partial reflections are in phase by symmetry. Accordingly, the partial reflections may be described by a single vector R in FIG. 10. For convenience, R is drawn along the positive real axis 120 and the phases of other vectors are drawn relative to it. In the following discussion it is also helpful to appreciate that the phase of the partial reflections is the same as if the reflections occured not at rung centres 31/32 but at their mid-point 33. This is so because the extra round-trip is $2 \times (\frac{1}{2}P) = P$, which has a phase shift $2n\pi$ at the centre frequency.

Waves B and D reflected by reflector strip 20 are described by vectors B and D lying respectively along the positive and negative imaginary axes 121 and 122, i.e. B and D respectively lead and lag R by 90°.

It is possible to combine the effects of blooming and directional reflectors to simplify design. To do this, the offset $\lambda/8$ must be changed to an offset $\lambda/8 + \delta$. Consider a two-rung transducer having M fingers per rung and an inter-rung reflector array having N strips, where N is greater than M. The fingers of the rungs $16_1$ and $16_2$ generate respective reflections $R_{F1}$ and $R_{F2}$ in phase with R and proportional in amplitude to M. Similarly, the reflector strips give rise to reflections $R_{R1}$ and $R_{R2}$ proportional to N but respectively leading and lagging R by a phase angle corresponding to the path difference $2(\lambda/8 + \delta)$, or $\pi/2 + \theta$, where $\theta = 4\pi\delta/\lambda$. Now the reflector strips and fingers have equal width, and the aperture Q or finger overlap defining the active acoustic region is equal to the reflector strip length. Moreover, the fingers and reflector strips are of the same metal and thickness, so they will have the same reflection properties. Accordingly, the amplitudes of $R_{F1}$, $R_{F2}$, $R_{R1}$ and $R_{R2}$ will include the same proportionality constant, k say, and:

$$|R_{F1}| = |R_{F2}| = kM, \text{ in phase with R,} \qquad (A)$$

and $$|R_{R1}| = |R_{R2}| = kN, \text{ phase} \pm (\pi/2 + \theta) \text{ to R,} \qquad (B)$$

It is assumed as a very good approximation that the reflection is small at each finger or reflector strip, so that each successive reflection leaves the transmitted amplitude substantially unaltered. This simplifies summing the reflected contributions, and does not affect the result substantially.

To provide a reflector strip arrangement which provides blooming and unidirectionality, the vectors $R_{F1}/R_{R1}$ and $R_{F2}/R_{R2}$ must give rise to vectors, say U and V respectively, which are equal and opposite to produce a situation equivalent to the FIG. 10 diagram. This gives rise to the vector diagram of FIG. 11, in which vector U is the resultant of vectors $R_{F1}/R_{R1}$ and vector V is the resultant of $R_{F2}/R_{R2}$. U and V correspond to vectors B and D in FIG. 10, and lie respectively along the positive and negative imaginary axes 131 and 132, or at $+\pi/2$ or $-\pi/2$ to R. It can be seen from Equations (A) and (B) in conjunction with FIG. 11 that:

$$\sin\theta = \frac{|R_{F1}|}{|R_{R1}|} = \frac{|R_{F2}|}{R_{R2}|} = \frac{kM}{kN} = \frac{M}{N} \qquad (C)$$

Accordingly, a ladder transducer of the invention having M fingers per rung will have both blooming and unidirectional properties if it incorporates reflector arrays having N strips, where N>M, the strips are dimensionally equivalent to the overlapping finger portions and the strips are offset by $\lambda/8 + \lambda\theta/4\pi(\theta = \arcsin M/N)$ from spatially periodic continuations of the transducer finger patterns. Whereas the above discussion relates to a two-rung transducer, it applies similarly to transducers having any number of rungs. The advantage of this and the previous arrangement using blooming is that all transducer and reflector fingers have widths $\lambda/4$, which facilitates production.

Transducers of the invention may be employed as described in filters, particularly in so-called front-end filters receiving antenna signals directly. This would reduce in-band spurious signals in IF mixer stages from cross-products between the local oscillator frequency and various unwanted received signals in other bands. Moreover, they may be used as IF filters provided that the relevant transducer design were to be of appropriate bandwidth. Mobile communications typically require 1 MHz bandwidth, for which the performance shown in FIG. 8, curve (a), is adequate. However, some applications require larger fractional bandwidths, for which a different design would be needed. At IF, this would allow fewer amplifier stages because of the low insertion loss characteristics of the invention. Moreover, the low insertion loss and linear group delay properties are of importance for use in oscillators such as the quartz crystal variety. Low insertion loss results in oscillations sustainable by one transistor, instead of two or more in the prior art, and linear group delay provides linear frequency modulation avoiding spurious sidebands—a familiar problem in the prior art. The low insertion loss property is particularly relevant to applications in which low power consumption and hence minimum amplification is important, such as battery powered devices.

The examples hereinbefore described have been shown with identical reflector banks with $\lambda/8$ offset, or the equivalent for the arrangement described with reference to FIG. 11 and providing both for blooming and unidirectionality. In practice, transducers may require special properties. These may be provided for example by the following:

(1) variation of reflector strip length or offset within each reflector array,
(2) varying the number of reflector strips per array,
(3) reflector strip width variation,
(4) reflector strip spatial periodicity variation, such as a "chirp" arrangement as in the reflector array compressor device,
(5) variations in transducer finger arrangements similar to (1) to (4) above, or
(6) combinations selected from (1) to (5).

In each case, transducer response may be calculated by a vector diagram related to that described with reference to FIG. 11.

I claim:

1. An acoustic transducer comprising a single layer metal conductor pattern on a substantially planar piezoelectric substrate, the pattern being arranged to define firstly a ladder transducer electrode configuration having rungs comprising transverse interdigital electrode fingers, and secondly at least one transverse reflector strip in an inter-rung position offset from spatial periodicity with the electrode fingers as appropriate to provide acoustic wave enhancement and reduction in respective mutually opposite directions in a given frequency band.

2. An acoustic transducer according to claim 1 having the said at least one reflector strip provided by at least one array of parallel reflector strips.

3. An acoustic transducer according to claim 1 wherein transducer finger length and/or reflector strip length are/is weighted to obtain desired transducer characteristics.

4. An acoustic transducer according to claim 1 arranged adjacent a second such transducer, the transducers being disposed to emit acoustic waves towards or away from one another.

5. An acoustic transducer according to claim 1 associated with acoustic absorbing means arranged on the substrate to absorb unwanted acoustic waves.

6. An acoustic transducer according to claim 1 arranged to be spatially aperiodic or of varying periodicity.

7. An acoustic transducer according to claim 1 having weighted finger overlap.

8. An acoustic transducer according to claim 7 having finger overlap varying in accordance with a sampled Fourier transform.

9. An acoustic transducer according to claim 8 having reflector strips located at one or more positions corresponding to zero finger overlap.

10. An acoustic transducer according to claim 2 having first reflector strips arranged for unidirectional transducer properties and second reflector strips providing blooming.

11. An acoustic transducer according to claim 2 having reflector strips positioned both for unidirectional transducer properties and for blooming, the reflector strips being offset by $$(\lambda/8) + (\lambda/4\pi) \arcsin (M/N)$$

from spatial periodicity with transducer finger centres, where M is the number of figures per transducer rung, N is the number of reflector strips per array and N is greater than M.

12. An acoustic transducer according to claim 10 having tranducer fingers and reflector strips $\lambda/4$ in width.

13. An acoustic transducer according to claim 2 wherein reflector strip length and/or width varies over the reflector array.

14. An acoustic transducer according to claim 2 including plurality of reflector arrays with differing numbers of reflector strips per array.

15. An acoustic transducer according to claim 2 wherein the reflector array has varying spatial periodicity.

16. An acoustic transducer according to claim 2 wherein the transducer fingers vary in length and/or width and/or number per rung.

17. An acoustic transducer according to claim 2 having varying transducer finger spatial periodicity.

18. An acoustic transducer according to claim 2 wherein transducer finger length and/or reflector strip length are/is weighted to obtain desired transducer characteristics.

19. An acoustic transducer according to claim 11 having transducer fingers and reflector strips $\lambda/4$ in width.

20. An acoustic transducer comprising a single layer metal conductor pattern on a substantially planar piezoelectric substrate, the pattern being arranged to define firstly a ladder transducer electrode configuration having rungs comprising transverse interdigital electrode fingers, and secondly at least one transverse reflector strip in an inter-rung position offset from spatial periodicity with the electrode fingers as appropriate to provide acoustic wave enhancement and reduction in respective mutually opposite directions in a given frequency band, wherein the said at least one reflector strip is offset by substantially $\lambda/8$ from a respective location distant $n\lambda/2$ from a transducer finger centre, where $\lambda$ is a wavelength corresponding to the transducer centre frequency and n is an integer.

21. An acoustic transducer according to claim 3 including reflector strips arranged in non-inter-rung locations.

22. An acoustic transducer according to claim 20 wherein transducer finger length and/or reflector strip length are/is weighted to obtain desired transducer characterics.

23. An acoustic transducer according to claim 21 wherein transducer finger length and/or reflector strip length are/is weighted to obtain desired transducer characteristics.

* * * * *

UNITED STATES PATENT AND TRADEMARK OFFICE
CERTIFICATE OF CORRECTION

PATENT NO.    : 4,642,506
DATED         : February 10, 1987
INVENTOR(S)   : LEWIS

It is certified that error appears in the above-identified patent and that said letters patent is hereby corrected as shown below:

Title page, item [56], under "References Cited U.S. PATENT DOCUMENTS", please add --3,950,713    04/76    Lewis    333/30 R--.

Signed and Sealed this

Eighteenth Day of March, 1997

Attest:

BRUCE LEHMAN

Attesting Officer    Commissioner of Patents and Trademarks

UNITED STATES PATENT AND TRADEMARK OFFICE
CERTIFICATE OF CORRECTION

PATENT NO. : 4,642,506
DATED     : February 10, 1987
INVENTOR(S) : LEWIS

It is certified that error appears in the above-identified patent and that said Letters Patent is hereby corrected as shown below:

Title page, item [56], under "References Cited U.S. PATENT DOCUMENTS", please add --4,464,597    08/84    Setsune    310/313.B--.

Signed and Sealed this

Eighth Day of September, 1998

Attest:

BRUCE LEHMAN

Attesting Officer

Commissioner of Patents and Trademarks